United States Patent
Xue et al.

(10) Patent No.: US 9,341,693 B2
(45) Date of Patent: May 17, 2016

(54) MOTION COMPENSATED MAGNETIC RESONANCE RECONSTRUCTION IN REAL-TIME IMAGING

(75) Inventors: Hui Xue, Franklin Park, NJ (US);
Christoph Guetter, Lawrenceville, NJ (US); Yu Ding, Columbus, OH (US);
Marie-Pierre Jolly, Hillsborough, NJ (US); Orlando P. Simonetti, Columbus, OH (US); Jens Guehring, Erlangen (DE); Sven Zuehlsdorff, Westmont, IL (US); Arne Littmann, Erlangen (DE)

(73) Assignees: Siemens Corporation, Islen, NJ (US);
Siemens Medical Solutions USA, Inc., Malvern, PA (US); Siemens Aktiengesellschaft, München (DE);
Ohio State University, Columbus, OH (US)

(*) Notice: Subject to any disclaimer, the term of this patent is extended or adjusted under 35 U.S.C. 154(b) by 979 days.

(21) Appl. No.: 13/413,812

(22) Filed: Mar. 7, 2012

(65) Prior Publication Data

US 2012/0235679 A1 Sep. 20, 2012

Related U.S. Application Data

(60) Provisional application No. 61/453,604, filed on Mar. 17, 2011.

(51) Int. Cl.
| | |
|---|---|
| G01R 33/44 | (2006.01) |
| G01R 33/565 | (2006.01) |
| G01R 33/561 | (2006.01) |
| G01R 33/563 | (2006.01) |

(52) U.S. Cl.
CPC ...... *G01R 33/56509* (2013.01); *G01R 33/5611* (2013.01); *G01R 33/56325* (2013.01)

(58) Field of Classification Search
CPC ............. G01R 33/5611; G01R 33/56325; G01R 33/56509
USPC ............ 324/300–322; 600/407–422; 382/131
See application file for complete search history.

(56) References Cited

U.S. PATENT DOCUMENTS

| | | | | |
|---|---|---|---|---|
| 8,577,177 | B2* | 11/2013 | Guetter et al. | 382/294 |
| 2002/0167315 | A1* | 11/2002 | Kellman et al. | 324/307 |
| 2008/0051648 | A1* | 2/2008 | Suri et al. | 600/407 |
| 2009/0284257 | A1* | 11/2009 | Bammer et al. | 324/307 |
| 2011/0081066 | A1* | 4/2011 | Jolly | G06T 7/0083 382/131 |
| 2012/0121154 | A1* | 5/2012 | Xue | G06T 7/0028 382/131 |
| 2012/0121200 | A1* | 5/2012 | Guetter et al. | 382/248 |

OTHER PUBLICATIONS

U.S. Appl. No. 13/291,370, filed Nov. 8, 2011.
A. Oberstein et al., "Obstacles to the routine use of magnetic resonance imaging-results of a multicenter study for evaluating nuclear magnetic resonance tomography," Digitale Bikidiagn, 10, 1990. (Abstract in English).

(Continued)

*Primary Examiner* — Melissa Koval
*Assistant Examiner* — Rishi Patel

(57) ABSTRACT

Magnetic resonance reconstruction includes motion compensation. Inverse-consistent non-rigid registration is used to determine motion between shots. The motion is incorporated into reconstruction. The incorporation compensates for the motion resulting from the period over which the MR data is acquired.

22 Claims, 8 Drawing Sheets

(56) References Cited

OTHER PUBLICATIONS

D. Atkinson, "Motion Correction," Montreal Sunrise Course: Image Reconstruction, ISMRM 2011.

P. G. Batchelor et al., "Matrix Description of General Motion Correction Applied to Multishot Images," Magnetic Resonance in Medicine 54 (2005), pp. 1273-1280.

D. Atkinson et al., "Nonlinear Phase Correction of Navigated Multicoil Diffusion Images," Magnetic Resonance in Medicine, 56 (2006), pp. 1135-1139.

F. Odille et al., "Generalized Reconstruction by Inversion of Coupled Systems (GRICS) Applied to Free-Breathing MRI," Magnetic Resonance in Medicine 60 (2008), pp. 146-157.

K. P. Pruessmann et al., "SENSE: Sensitivity Encoding for Fast MRI," Magnetic Resonance in Medicine 42 (1999), pp. 952-962.

M. A. Griswold et al., "Generalized Autocalibrating Partially Parallel Acquisitions (GRAPPA)," Magnetic Resonance in Medicine 47 (2002), pp. 1202-1210.

F. Breuer et al., "Dynamic Autocalibrated Parallel Imaging Using Temporal GRAPPA (TGRAPPA)," Magnetic Resonance in Medicine 53 (2005), pp. 981-985.

P. Kellman et al., "Adaptive Sensitivity Encoding Incorporating Temporal Filtering (TSENSE)," Magnetic Resonance in Medicine 45 (2001), pp. 846-852.

G. E. Christensen et al., "Consistent Image Registration," IEEE Transactions on Medical Imaging, vol. 20, No. 7, Jul. 2001, pp. 568-582.

M. Hernandez et al., "Registration of Anatomical Images Using Paths of Diffeomorphisms Parameterized with Stationary Vector Field Flows," International Journal of Computer Vision 85, (2009), pp. 291-306.

D. Rueckert et al., "Nonrigid Registration of Medical Images: Theory, Methods, and Applications," IEEE Signal Processing Magazine 27 (2010), pp. 113-119.

C. Chefd'hotel et al., "Flows of Diffeomorphisms for Multimodal Image Registration," Proceedings of the IEEE ISBI, (2002), pp. 753-756.

P. B. Roemer et al., "The NMR Phased Array," Magnetic Resonance in Medicine 16, (1990), pp. 192-225.

D. O. Walsh et al., "Adaptive Reconstruction of Phased Array MR Imagery," Magnetic Resonance in Medicine 43 (2000), pp. 682-690.

I.T. Jolliffe, "Principal Component Analysis," Springer, New York, (2002).

Per Christian Hansen, "Rank-Deficient and Discrete III-Posed Problems: Numerical Aspects of Linear Inversion," SIAM, ISBN:0-89871-403-6, (1998) (abstract).

Y. Ding et al., "A Method to Assess Spatially Variant Noise in Dynamic MR Image Series," Magnetic Resonance in Medicine 63 (2010), pp. 782-789.

\* cited by examiner

MOTION COMPENSATED MAGNETIC RESONANCE RECONSTRUCTION IN REAL-TIME IMAGING

RELATED APPLICATIONS

The present patent document claims the benefit of the filing date under 35 U.S.C. §119(e) of Provisional U.S. Patent Application Ser. No. 61/453,604, filed Mar. 17, 2011, which is hereby incorporated by reference.

FEDERALLY SPONSORED RESEARCH OR DEVELOPMENT

The U.S. Government has a paid-up license in this invention and the right in limited circumstances to require the patent owner to license others on reasonable terms as provided by the terms of award no. R01HL102450, awarded by National Heart, Lung, and Blood Institute.

BACKGROUND

The present embodiments relate to motion compensation in magnetic resonance imaging. Patient motion may degrade the image quality in magnetic resonance imaging (MRI) and cause unwanted image blurring or ghosting. More than 8% of magnetic resonance (MR) scans may be subject to motion, resulting in impaired diagnostic quality.

The undesired effects of patient motion during MRI may result, in part, from the Fourier transform (FT) of the acquired k-space data. Any inconsistency in the k-space caused by motion may influence many or every pixel in the image domain.

Prospective or retrospective methods have been used to account for motion. Prospective approaches, such as breath-holding, ECG monitoring, or respiratory gating, require extra clinical set-up and often suffer from limited performance. The patient may fail to hold their breath for sufficient time. Prospectively adjusting the image acquisition is often not possible due to scan time and contrast limits or difficulties to modify the MR imaging sequences. The prospective techniques mainly deal with rigid or affine type motion, which is insufficient for applications like cardiac or liver imaging. The retrospective methods include retrospective gating, which sacrifices the image efficiency by rejecting acquired data if significant motion is detected.

MR reconstruction may incorporate motion compensation to cope with rigid motion or non-rigid deformation. If the MR data acquisition is performed in a multi-shot or multi-segment manner and the motion between each shot is known, the motion compensation may be achieved by solving a general matrix inversion problem. Although the theory of conducting multi-shot MR motion compensation using general matrix inversion has been established, the application of this framework is rare, mainly due to the difficulties of estimating a complete displacement field for every pixel in the image at every shot. An attempt to bypass this problem provides a model of motion within the field of view. The model is parameterized as a linear combination of selected input basis signals, such as navigator echoes or respiratory belts or signals derived from ECG. The optimization process is extended to interleave the estimation of a motion-free image and motion model by solving two large linear equations consecutively. While avoiding the estimation of deformation fields, this approach complicates the matrix representation of MR motion compensation and couples the motion estimation and compensation. The computational costs are largely increased, leading to reconstruction time of the order of 10 minutes.

BRIEF SUMMARY

By way of introduction, the preferred embodiments described below include methods, systems, instructions, and computer readable media for motion compensated magnetic resonance reconstruction. Inverse-consistent non-rigid registration is used to determine motion between shots. The motion is incorporated into reconstruction. The incorporation compensates for the motion resulting from the period over which the MR data is acquired.

In a first aspect, a method for motion compensated magnetic resonance reconstruction is provided. For each of multiple coils, magnetic resonance data representing an interior region of a patient is acquired with multiple shots. An initial reconstruction is performed, for each of the multiple coils, for each of the shots. Motion is determined between the initial reconstructions of the multiple shots with an inverse-consistent non-rigid registration for each of the multiple coils. A coil image is reconstructed, for each of the multiple coils, with a matrix inversion solver as a function of the motion and the magnetic resonance data for the multiple shots. The coil images for the multiple coils represent the interior region of the patient. The coil images from the multiple coils are combined into an output image. The output image representing the interior region of the patient is displayed.

In a second aspect, a non-transitory computer readable storage medium has stored therein data representing instructions executable by a programmed processor for motion compensated magnetic resonance reconstruction. The storage medium includes instructions for acquiring magnetic resonance data with multiple shots, determining motion between the shots of the multiple shots, applying an inverse-consistent non-rigid registration, and reconstructing an image as a function of the magnetic resonance data from the multiple shots and the determined motion.

In a third aspect, a non-transitory computer readable storage medium has stored therein data representing instructions executable by a programmed processor for motion compensated magnetic resonance reconstruction. The storage medium includes instructions for performing multi-segment magnetic resonance imaging, and compensating for motion in the multi-segment magnetic resonance imaging with an inverse-consistent non-rigid registration.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 7(d) shows eigen values by coil in one example;

DETAILED DESCRIPTION OF THE DRAWINGS AND PRESENTLY PREFERRED EMBODIMENTS

Figure 1:
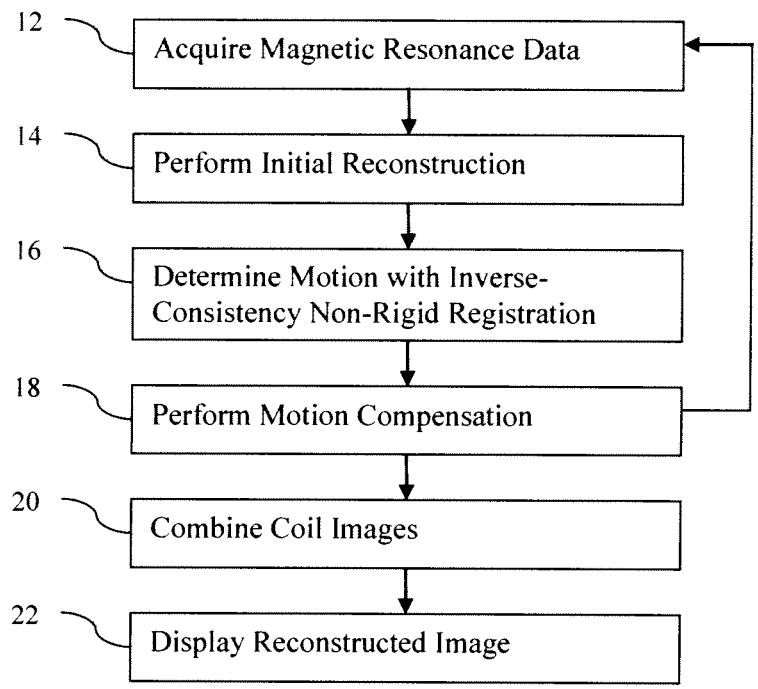
FIG. 1 is a flow chart diagram of one embodiment of a method for motion compensated magnetic resonance reconstruction.

Motion compensated magnetic resonance (MR) reconstruction uses inverse-consistent deformable registration. Inverse-consistent non-rigid registration is used to correct complex motion and is an efficient algorithm. The inverse-consistent non-rigid registration is incorporated as an extension of a MR motion compensation framework. For the framework, a matrix description of MR motion compensation is proposed in P. G. Batchelor, et al., "Matrix description of general motion correction applied to multishot images," Magnetic Resonance in Medicine, 54(5), 1273-1280, 2005. In this paper, the motion between shots is assumed to be known. Conversely, as an effective strategy to estimation motion, inverse-consistent non-rigid registration is incorporated into the framework. This motion estimation allows the use of the MR motion compensation framework in practical MR imaging applications, including multi-shot or multi-segment MR acquisitions.

The pixel-wise dense forward and backward deformation fields are estimated using the inverse-consistent non-rigid registration for every time shot or segment. In a matrix inversion step for reconstruction, the estimated motion field is treated as a prior, simplifying the solving process and reducing the reconstruction time to the order of 1 second per phase or frame. By decoupling motion estimation from compensation (e.g., determining the registration independent of solving the matrix in reconstruction), more efficient or computationally less expensive motion compensation can be achieved.

The motion compensation is fully automated and no manual interaction is required; thus fully unsupervised retrospective motion compensation can be performed. Cardiac imaging, 3D contrast enhancement MRI, liver imaging and other applications whose image quality is jeopardized by respiratory motion may benefit. For cardiac imaging, real-time cine, real-time fat-water imaging and free-breathing delay-enhancement and perfusion imaging may incorporate motion compensation step. Motion compensation in cardiac real-time cine MRI may be provided. For example, the ghosting artifacts due to chest wall motion may be suppressed. This motion compensation may be implemented as a part of general MR parallel imaging package. The motion compensation may work with standard SENSE or GRAPPA reconstructions or their temporal versions (e.g., temporal GRAPPA or TGRAPPA and temporal SENSE or TSENSE).

The motion compensation for multi-shot/multi-segment MR imaging is performed using inverse-consistent non-rigid registration. The conjugate transpose of a mixing matrix $g^H$ is composited using the inverse deformation field $u^1$ estimated from the inverse-consistent non-rigid registration. For multiple coils, the general matrix inversion and corresponding motion detection may be performed for all coils or on selected eigen-channels. The motion compensated reconstruction algorithm for the multi-coil imaging uses the inverse-consistent non-rigid registration with parallel imaging (see FIG. 2) or uses the inverse-consistent registration and eigen-channel with parallel imaging (see FIG. 3). The motion compensated reconstruction algorithm may be used for the time-interleaved multi-coil dynamic imaging with inverse-consistent registration and eigen-channel for parallel imaging (see FIG. 4).

FIG. 1 shows a flow chart of a method for motion compensated magnetic resonance reconstruction. The method is implemented by the system of FIG. 9 or another system. For example, the method is implemented on a computer or processor associated with a MRI system or PACS. The acts are performed in the order shown or other orders. Additional, different, or fewer acts may be provided. For example, the method is performed without multi-coils, so the repetition of acts 12-18 and the combination of coil images in act 20 are not provided. As another example, eigen-related acts are provided, such as identifying eigen coils and a cutoff. In yet another example, the display of act 22 is not provided, but instead the image is stored or transmitted.

FIG. 1 provides for motion compensation in multi-segment or multi-shot MRI. A shot or segment is one or more transmissions of MRI pulses. A sequence of such shots is a multi-shot or multi-segment scan where the data from the different shots is used to form an image. A shot or segment is a portion of k-space (e.g., frequency selection), and the assumption is that all k-space points in a shot are acquired in a very short period so that k-space data for each shot is always self-consistent. This short period may be 50-200 milliseconds, such as acquiring data over about 400 milliseconds in four shots, each about 100 milliseconds. Multi-shot MRI may be used for many cardiac and 3D imaging applications. Such rapid imaging sequences include EPI or B-SSFP.

Figure 2:
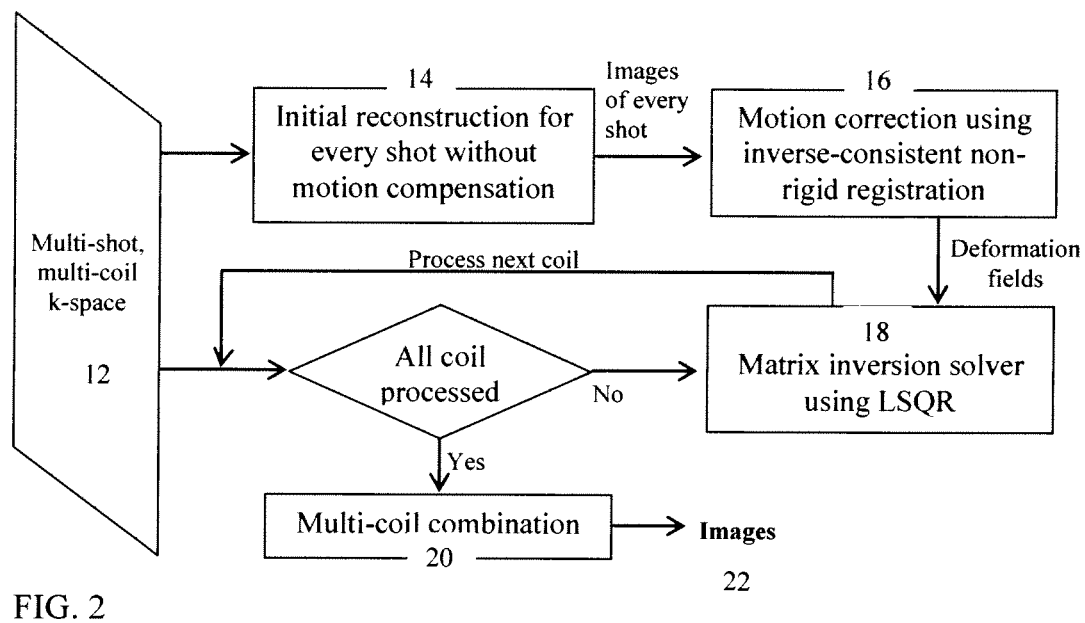
FIG. 2 is a flow chart diagram of a method for motion-compensated reconstruction for multi-coil acquisition, according to one embodiment.
Figure 3:
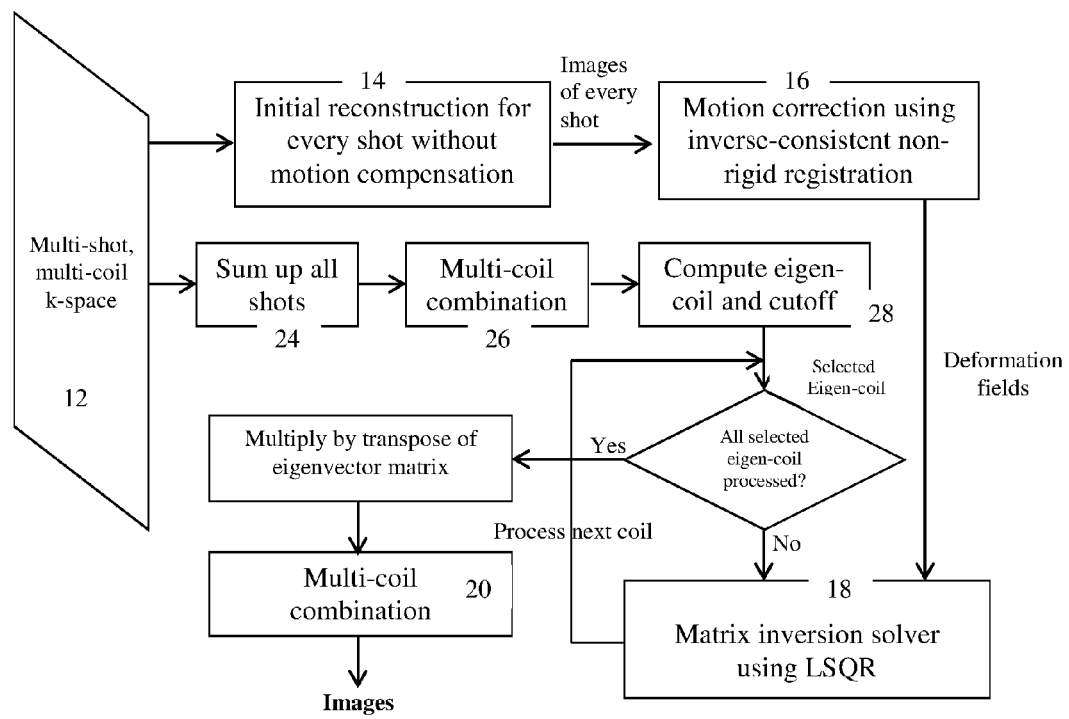
FIG. 3 is a flow chart diagram of a method for motion-compensated reconstruction for multi-coil acquisition, according to an embodiment using eigen-coils.
Figure 4:
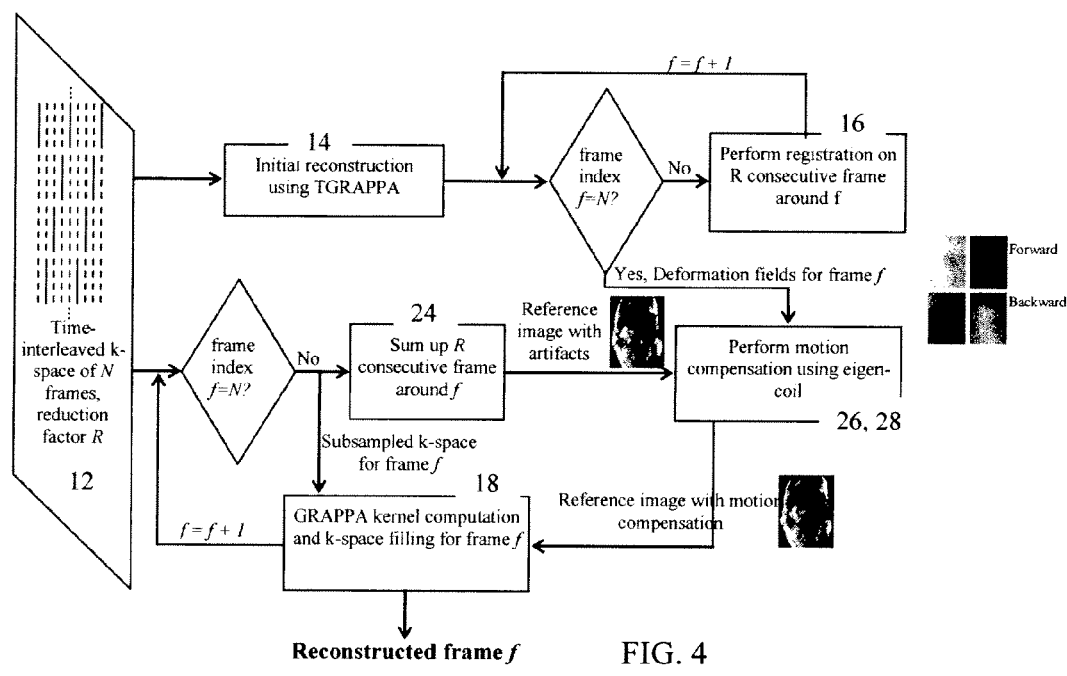
FIG. 4 is a flow chart diagram of a method for motion-compensated reconstruction for multi-coil acquisition, according to an embodiment for dynamic imaging with time-interleaved k-space acquisition.

FIGS. 2-4 implement the motion compensation of FIG. 1 in a multi-coil environment. FIG. 1 represents the general motion compensation framework with inverse-consistent non-rigid registration. FIGS. 2-4 show reconstruction performed for multi-coils, such as in time-interleaved multi-coil dynamic imaging. The motion compensation using inverse-consistent registration is described for dynamic parallel imaging applications. In vivo, free-breathing real-time cardiac cine images may be acquired with motion compensation.

In act 12, magnetic resonance data is acquired. The magnetic resonance data is k-space data or data converted to object space. The MR data is acquired by scanning a patient. In response to application of magnetic fields and one or more pulses, data representing an interior region of a patient is acquired with multiple shots. For example, the MR data is acquired using a time-interleaved, multi-coil dynamic imaging sequence of pulses. As another example, the MR data is acquired as frames or shot divisions of k-space data.

The MR data is acquired as part of the motion compensation framework. Given a multi-shot/multi-segment MR acquisition, the k-space data acquired within every shot is consistent and substantially free of motion artifacts due to the quick (e.g., less than 200 millisecond) readout. Substantially free allows for some motion, but less than associated with heart motion over 400 milliseconds. The acquisition is quick compared to the physical movement.

Suppose the MR acquisition consists of $n_s$ shots, presenting a $n_1 \times n_2$ image. The k-space sampling pattern for every shot is defined by the sampling matrix $A_s(n_1 \cdot n_2 \times_1 \cdot n_2)$. The sampling matrix is a binary indication of the data associated with a given shot. The observed image $S_o(n_1 \cdot n_2 \times 1)$ is corrupted by motion $u_s(n_1 \cdot n_2 \times n_1 \cdot n_2)$ for every shot. The final image with motion artifacts $S(n_1 \cdot n_2 \times 1)$ may be expressed by the following matrix equation:

$$S = \left(\sum_{s=o}^{n_s} F^H \cdot A_s \cdot F \cdot u_s\right) \cdot S_0 = g \cdot S_o$$

where $F(n_1 \cdot n_2 \times n_1 \cdot n_2)$ is the Fourier transform and $F^H$ is the inverse of F (hermitian conjugate). $u_s$ is the image transform, corresponding to the deformation of every shot. $u_s \cdot S_o$ represents the transformed image intensities at various coordinate, not the coordinates themselves. $u_s \cdot S_o$ may be efficiently computed by any image interpolation operation. In the most simplified nearest-neighbor interpolation, $u_s$ is a permutation matrix that reorders the pixels in the image. The permutation matrix offers flexibility to represent non-rigid deformation.

To detect the deformation in act 16, an initial reconstruction is performed in act 14. The data acquired in act 12 is transformed to object space for each shot. The data of each shot is separately reconstructed. Any reconstruction may be used, such as TGRAPPA. This initial reconstruction does not account for motion. Alternatively, the data acquired in act 12 is already in object space and separate for each shot.

The above matrix formula describes the effects of motions on a final image. The term $$\sum_{s=0}^{n_s} F^H \cdot A_s \cdot F \cdot u_s \cdot S_0$$

provides that the final image is the sum of every shot. For each shot, the original image in object space is first transformed by the motion $u_s$ detected in act 16 and then Fourier transformed to k-space for the reconstruction by matrix solution in act 18. Only the points belonging to each shot are kept by the respective sampling matrix $A_s$. Finally, k-space points for every shot are inversely transformed back to the object or image domain and summed up in the reconstruction and motion compensation of act 18.

If there is no motion ($u_s$ is an identity matrix), the per-shot aliasing which is a mathematical consequence of subsampled k-space, destructively cancels out and an artifact-free image is obtained. When shots are acquired with an object in different positions, $u_s$ is not an identity matrix and ghosting may appear in the final image as the cancelling is not complete. To estimate the motion-free image $S_o$, the inversion of ghosting matrix g is obtained.

For reconstruction, the matrix inversion of g is large, such as in the order of ~1e6 or larger for most imaging protocols. A conjugate gradient solver, such as LSQR, may only require the computation result of matrix-vector product $g \cdot S$ and $g^H \cdot S$, which may be efficiently computed using image pixel-wise operations. For example, FFT and image interpolation, given the image size result $n_1 \times n_2$ is reshaped to or from the vector $n_1 \cdot n_2 \times 1$. The ghosting matrix may not be invertible, which may be caused by small field of view or drastic motion such that a portion of object moves out of the image for some shots. In this case, the conjugate gradient solver may give a generalized inversion solution.

In act 16, motion between the shots is determined. The MR data for each shot in the object space is used to determine motion. The motion between pairs of shots or between each shot and all of the other shots is determined. The motion in a sequence of shots is calculated. Different motions are determined between different groups or pairs of shots, such as determining motions from a first shot to a second, to a third and to a fourth shot. The motion between different sets of MR data for the different shots is determined.

For each comparison of MR data, a motion field is determined for non-rigid registration. The motion field represents pixel or sub-region motion for each of a plurality of pixels or object space sub-regions. The motion for each pixel or sub-region is a vector.

With the matrix description of motion compensation and its fast solver in hand, what is missing is the deformation field $u_s$ for every shot. Each shot is treated as a deformation from a reference, such as a first shot. Since the $g^H \cdot S$ is used by the solver and:

$$g^H = \sum_{s=o}^{n_s} u_s^H \cdot F^H \cdot A_s \cdot F,$$

the transpose of spatial deformation $u_s^H$ is used. The transpose may be computed by explicitly computing the ghosting matrix g. However, such a computation may disable the fast algorithm using image based operations. If the inverse deformation $u_s^{-1}$ is given in the sense of inverse consistency $u_s^{-1} \cdot u_s = \text{id}$, the $u_s^H$ may be replaced by $u_s^{-1}$. In this way, the image operation is applied to computing both $g \cdot S$ and $g^H \cdot S$.

By determining the motion prior to or outside of the reconstruction, the motion is estimated independent of the reconstruction. The initial reconstruction of act 14 is used to determine the motion field in act 16. The motion field (e.g., inverse deformation) is then used in reconstruction. Since the motion is determined from reconstructions of the MR data for each shot, the motion is determined in object space. The motion is between the initial reconstructions of multiple shots rather than being iteratively solved as part of the reconstruction matrix.

The motion field is determined with an inverse-consistent non-rigid registration. The inverse-consistent non-rigid registration is applied to the reconstructed shot images. Pixel-wise dense forward and backward deformation fields are estimated with the inverse-consistent non-rigid registration. A gradient of a symmetric energy functional is iteratively descended by alternating a registration direction after each iteration while enforcing inverse consistency.

The general motion compensation and its fast computation require the availability of both forward and backward deformation fields $u_s$ and $u_s^{-1}$ for every shot. To estimate both forward and backward deformation, the inverse consistent non-rigid registration algorithm is used. This registration estimates both deformation fields using an interleaved optimization scheme and maintains the symmetry and inverse-consistency of image alignment. In this optimization, the gradient of a symmetric energy functional is descended by alternating the registration direction after each iteration. At the same time, inverse consistency is enforced through updating the inverse direction.

The inverse-consistency optimization may be flexibly combined with variant non-rigid algorithms, such as Free Form Deformation/B-Spline based methods. In one embodiment, the inverse-consistency optimization is performed with a variational registration framework, as the variational registration framework produces the pixel-wise deformation field used by the matrix description of motion compensation. Specifically, the image alignment is achieved as the solution to a calculus of variation problem, which is solved by performing a compositional update step corresponding to a partial differential transport equation. The regularization is added by low-pass filtering the gradient images which are in turn used as a velocity field to drive the transport equation.

To speedup the convergence and avoid local minima, a multi-scale image pyramid is created and used. The registration is repeated for different resolutions where the motion determined for a lower resolution is used as the feedback for limiting the search range for registration in a higher resolution. The local cross correlation is the image similarity measure, as the explicit derivative can be more efficiently calculated than mutual information and still general enough to cope with intensity fluctuation and imaging noise. Mutual information may alternatively be used. The numerical implementation of this scheme may be performed efficiently and the resulting algorithm requires little extra time per iteration when compared to a one-directional method.

One example of the inverse-consistent non-rigid registration is shown in U.S. Published Application No. 2012/0121200, the disclosure of which is incorporated herein by reference. The embodiments show calculating a first update of a forward transformation of a first digital image to a second digital image from a previous update of the forward transformation and a gradient of a cost function of the first and second digital images. A first update of a backward transformation of the second digital image to the first digital image is calculated from an inverse of the first update of the forward transformation. A second update of the backward transformation is calculated from first update of the backward transformation and the gradient of a cost function of the second and first digital images. A second update of the forward transformation is calculated from an inverse of the second update of the backward transformation.

Any motion is determined. For example, a motion field is determined. For reconstruction in act 18, an inverse deformation field may be calculated from the inverse-consistent non-rigid registration.

In act 18, an image is reconstructed while including motion compensation. The reconstruction is a function of the magnetic resonance data from the multiple shots and the determined motion. The data and motion field(s), such as the inverse deformation field(s), are used by a matrix inversion solver. The solver is applied to the matrix discussed above.

The matrix includes data from multiple shots and the corresponding motion fields. Where the shots are from a given coil, the resulting reconstructed image is for that coil. Through repetition, motion compensated coil images for different coils may be calculated, as reflected in the line connecting act 18 with act 12.

By incorporating the motion field determined prior to reconstruction, the solution compensates for the motion in multi-segment magnetic resonance imaging. The motion field is treated as a prior in the matrix inversion solver. The motion is determined in object space. The motion in the object space is used to compensate in the k-space reconstruction. The motion field used to compensate for motion is Fourier transformed into k-space. The inverse matrix solver reconstructs from the k-space data and inversely transforms for each shot into an object space image. The data for different shots is combined into the matrix solution to output a reconstruction. The inverse matrix solver applies a conjugate gradient solver. A conjugate transpose of a mixing matrix is composited with the inverse deformation field.

In act 20, coil images in multi-coil embodiments are combined. The reconstructed images for the different coils are combined in object space. Sum-of-square coil combination, adaptive coil combination, or other combination may be used. By combining for all coils or a sub-set of coils selected based on eigen-channels, an output image is generated. In alternative embodiments, one image is output as the reconstruction, such as where one coil is used.

In act 22, the image is displayed. The image is a reconstruction of the MR data representing the patient. The image represents an interior region of the patient. The image is a two-dimensional image or a rendering from voxel data representing three-dimensions.

The image is displayed on a display of an MRI system. Alternatively, the image is displayed on a workstation, computer or other device. The image may be stored in and recalled from a PACS memory.

FIGS. 2-4 shows different embodiments of the implementation of the method of FIG. 1 in multi-coil imaging. In these methods, the multi-shot or multi-segment motion compensation and reconstruction is performed separately for each coil in a group of coils. For FIG. 2, the motion compensation and reconstruction is performed separately for all coils. For FIGS. 3 and 4, the motion compensation and reconstruction is performed separately for a sub-set of coils. The sub-set is selected based on eigen-channels or coils.

k-space data is acquired for each coil in act 12. The k-space data for each coil is associated with multiple shots, such as four shots. Each coil is used to receive data responsive to pulses applied to molecules disposed in a strong magnetic field and subjected to gradient magnetic fields. The data for each coil is received simultaneously or in response to a same pulse or shot, or the data for each coil is received sequentially.

The k-space MR data is used for motion compensated MR reconstruction with multiple coils. The usage of multiple phase array coils provides parallel imaging and may provide good signal-to-noise ratio (SNR). Motion compensation is provided in the context of multi-coil imaging with parallel acquisition to take advantage of these benefits to multiple coil acquisition.

In FIG. 2, the acquired data is processed in two paths. One path is for registration and the other path is for reconstruction. The reconstruction path includes a feedback loop to perform reconstruction for each coil. In FIGS. 3 and 4, the acquired data is used in a third path. The third path includes summing the magnetic resonance data from the multiple shots for each of the coils in act 24, combining the summed magnetic resonance data from all of the coils in act 26, and selecting the sub-set of data as a function of eigen-coil images of the combined data in act 28.

In the motion registration path, an initial reconstruction is performed for each shot of each coil in act 14. In alternative embodiments, the initial reconstruction is performed only for shots of a sub-set of coils, such as the sub-set selected in act 28.

The non-rigid registration of act 16 is performed on magnitude images after a fast initial imaging reconstruction for every shot in act 14. The initial reconstruction does not include motion compensation. In the dynamic imaging scenario of FIG. 4, the initial reconstruction may be achieved by an initial TSENSE or TGRAPPA reconstruction. In multi-segment 3D imaging, images for every shot may be obtained by a rough re-gridding reconstruction. In 2D imaging cases, such as for FIGS. 2 and 3, the initial reconstruction may be achieved by a SENSE recon. Other reconstruction techniques may be used.

In act 16, the motion associated with each shot is determined. One shot is used as a reference from which the motion in other shots is determined. Alternatively, adjacent pairs of shots are compared for registration, providing a moving reference.

The same data used for reconstruction in act 18 is used for determining the motion. Alternatively, a low-resolution pre-scan may be used to determine motion before running a normal protocol if the motion is periodic and reproducible. Different data is acquired for determining motion than used for reconstruction.

The motion is determined for each coil. The determination is independent of data or motion from other coils. The motion for shots of each coil is determined without reference to motion in other coils. Alternatively, the motion determined from one coil is used to limit a search area or otherwise more efficiently determine the motion for other coils.

The motion is determined for all the coils. FIG. 2 illustrates repetition to correct motion for every coil independently. In alternative embodiments represented in FIGS. 3 and 4, the motion may be determined for a selected sub-set of coils and not other coils.

In act 18, reconstruction is performed for each of the coils. In the embodiment of FIG. 2, the reconstruction and registration acts are performed for all of the coils independently. Repeating the solver on every coil may require a high computational cost. For example, some imaging procedures may use 32 or more channels (i.e., coils) in the clinical setting.

In one embodiment, reconstructing data from all of the coils may be avoided by selecting data for only a sub-set of the coils to be reconstructed. Where a total of $n_r$ coils are used for imaging, the ghosting matrix formula may be listed for every coil as:

$$S_r = \left( \sum_{s=o}^{n_s} F^H \cdot A_s \cdot F \cdot u_s \right) \cdot C_r \cdot S_0 = g_r \cdot S_0$$

where $C_r$ is the coil sensitivity for the channel r. The above matrix equation may be repeated for every coil and stacked together except $S_o$, ending up solving a linear system of $n_r \cdot n_1 \cdot n_2 \times n_1 \cdot n_2$. The image pixel-wise operation is applied to solving this matrix equation. The coil sensitivity is determined before reconstruction and may be measured from a pre-scan. In many applications, estimation of precise coil sensitivity is problematic because the scan time is limited or the bulk motion of chest wall or abdomen may alter the coil sensitivity between shots.

FIGS. 3 and 4 show use of an eigen analysis to select only data for a sub-set of the coils for reconstruction and/or registration. For example, the matrix inversion is performed only on data from one or more selected eigen-channels. The data from the different shots is summed in act 24. The data from the different coils is combined in act 26. An 'eigen-coil' is formed to reduce the computational cost without requiring the coil sensitivity. The eigen-coil is computed by performing a Karhunen-Loeve Transform or principal component analysis on the multi-coil images. Suppose a set of $n_r$ coils, each coil acquires an image of $n_1 \cdot n_2$ pixels at the same time. These $n_r$ images may be represented by a $n_r \times n_1 \cdot n_2$ data matrix D. As the same object is imaged by all coils and there are overlaps between coil sensitivities, images from every coil include redundant information. Therefore, the empirical covariance matrix of D, defined as $$\frac{DD^H}{n_1 n_2},$$

has maximal $n_r$ non-zero eigenvalues. The covariance matrix represents the correlation of the data from the multiple coils. The eigen-coil images are computed by multiplying the data matrix by corresponding eigenvectors. The eigen values are sorted by magnitude, and the first few eigen-coil images occupy the most image content while those corresponding to small eigen values are basically representing noise. The motion compensation is performed on a sub-set of the eigen-coil images corresponding to image content without jeopardizing the accuracy. Any number of eigen-coil images may be selected in act 28, such as the first 5 or 10. Alternatively, the eigen-coil images with a threshold eigen-value level are selected. By selecting the eigen-coils to be processed, the computational cost is reduced and no coil sensitivity is necessary.

The reconstruction of the eigen-coil or actual coil data provides coil images. One or more coil images are reconstructed. The process repeats for each of the coil images to be generated, such as through the sub-set of eigin-coils. Each reconstruction includes motion compensation associated with detected motion for the shots of the coil.

The reconstructed coil images are combined in act 20. Once all coil images are compensated, sum-of-square coil combination, adaptive coil combination, or other coil combination is performed to get the magnitude image. The magnitude image is an output image representing the scanned region of the patient. A sequence of such magnitude images may be generated over time.

The magnitude image may be further processed. For example, the magnitude image is filtered. As another example, segmentation is applied.

FIG. 4 shows the use of motion compensation in real-time cine imaging. Real-time cine imaging of the heart does not require a breath-hold and is capable of handling arrhythmia with irregular cardiac rhythm. Real-time cine imaging may be beneficial for clinical applications like stress imaging where patients may undergo pharmaceutical or exercise stress immediately before the MR acquisition and cannot hold their breath at all. The state-of-art real-time cine MR imaging employs multi-coil parallel imaging with the time-interleaved undersampled k-space acquisition between consecutive frames and may be reconstructed using temporal GRAPPA (TGRAPPA) or temporal SENSE (TSENSE) reconstruction in act 18. Both TGRAPPA and TSENSE merge the information from adjacent frames to estimate the coil sensitivity for TSENSE or autocalibration signals (ACS) for TGRAPPA. In the stress real-time imaging where the patient heart-rate is so high and respiratory motion is extremely heavy, the estimated coil sensitivity may mismatch the image data, resulting in the ghosting artifacts in the reconstructed image.

The motion compensation of FIG. 1 may be applied to correct chest-wall motion between adjacent frames in the real-time imaging of FIG. 4. Each frame is treated as a collection of shots. FIG. 4 shows the acquisition of a sequence of frames in act 12. The frames are divided by a reduction factor, such as a reduction factor of four. Greater or lesser reduction factors may be used. The reduction factor is used to separate the k-space data of a given frame into shots or sets of data acquired at similar times. The frame is sub-sampled to provide shots.

Artifacts in the coil sensitivity estimation may also be avoided by the motion compensation. An initial reconstruction is performed in act 14, such as using TGRAPPA. In act 16, the frame-to-frame deformation fields are estimated from the reconstructed magnitude images. To reconstruct frame f, every R neighboring k-spaces around f are treated as R shots from a MR acquisition, and a motion-compensated reference is computed by solving the general matrix inversion with the deformation fields as inputs. This reference k-space is fed into the GRAPPA computation to reconstruct frame f in act 18. To limit processing requirements, eigen-coil selection is performed in act 28. The coil images for all of the coils are combined after act 18 and prior to act 22.

Since the imaging is real-time or dynamic, the data for eigen-analysis is represented by a moving window. Any size window may be used, such as summing R frames surrounding a frame being processed as the multi-coil combination in act 26.

The flow of FIGS. 1-4 may be implemented as a program. For example, the flow is implemented as a mixture of C++ and Matlab, but other languages may be used. The inverse-consistent non-rigid registration is implemented using C++ and compiled as the dynamic link library (Matlab mex file) to be called up within Matlab. The inputs of this function are reference and floating images. The forward and backward deformation fields are generated as outputs. The general matrix inversion solver is implemented using Matlab by calling a supplied LSQR function. A routine is fed into the LSQR to compute the matrix-vector products g·S and $g^H$·S.

As the pixel-wise image operations are used to compute the matrix-vector products, the total computation is of image warping using interpolation, FFT, pixel-wise multiplication of sampling matrix A, and inverse FFT. The cost for the image warping is O(MN) where M is the length of interpolation kernel and N is the number of total pixels in the image (M<<N in general). For both FFT and its inverse, the costs are O(NlogN) while the pixel-wise multiplication of sampling matrix is virtually costless. Compared to the cost of $O(N^2)$ to explicitly compute the ghosting matrix g and related complex bookkeeping and memory allocation, the implicit image operation can provide a significant speedup.

Using a dual-core desktop with 3.00 GHz cpu and 6 GB RAM without utilizing multi-threading, the typical time cost for a non-rigid registration may be less than 0.1 ms (image size 320×80). The LSQR solver takes ~1 s to perform the motion compensation on each eigen-coil image. For the conjugate gradient solver, the number of iterations may influence the noise amplification by acting as a regularization term. In one embodiment, the solver is run for 15 iterations. Greater or fewer iterations may be provided. More iterations may not lead to discernibly improved correction.

Figure 5:
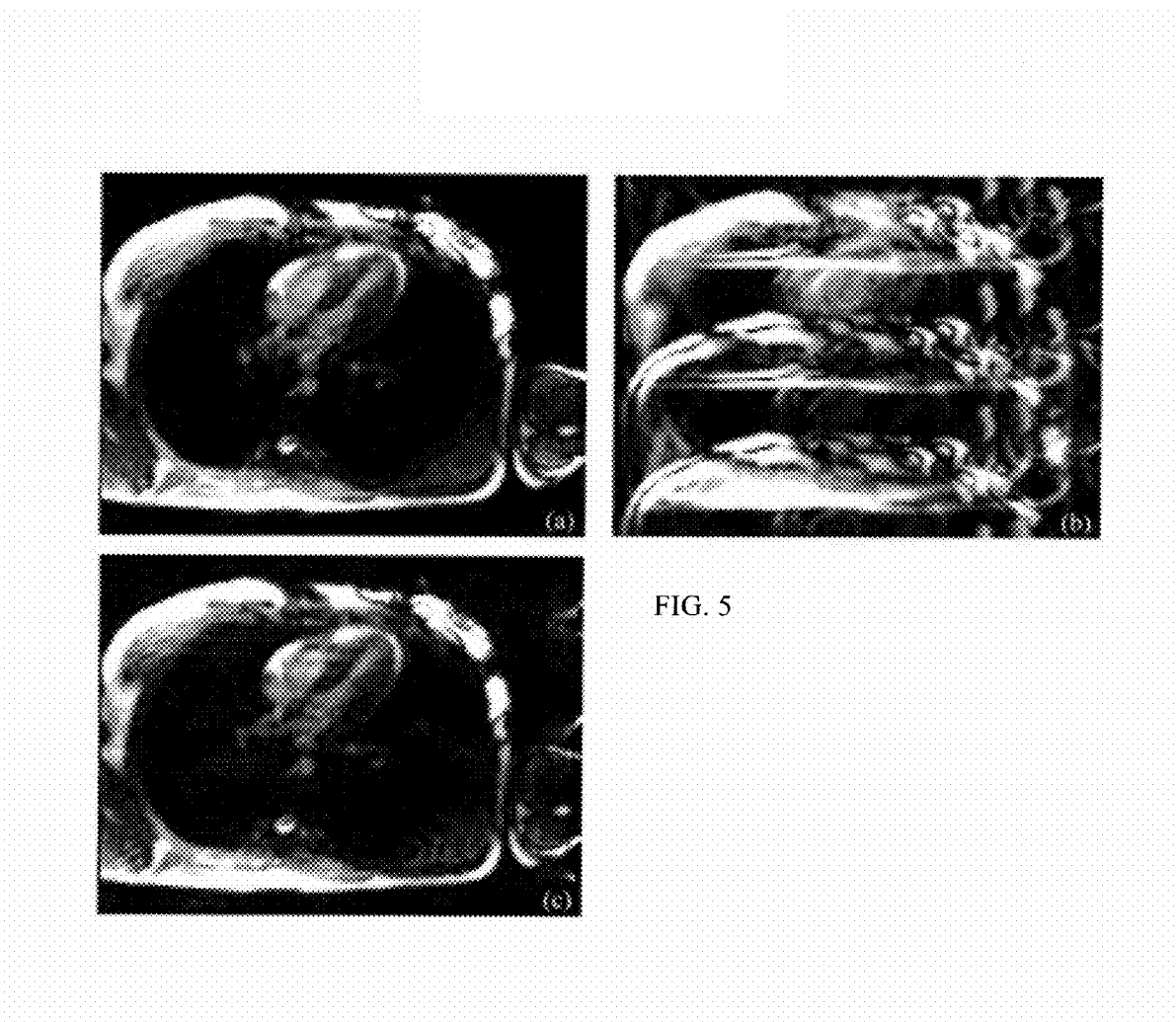
FIGS. 5(a-c) show example simulated MR images illustrating the effects of motion.

FIG. 5 shows the results of a simulation using inverse-consistent non-rigid registration for motion compensation in MRI. A magnitude image is converted into k-space and divided into 3 shots by picking every 3rd component of the linearly indexed k-space. FIG. 5(*a*) shows the original image. A total of four arbitrary affine transformations are generated by making random 2×3 matrixes, simulating motion between the shots. FIG. 5(*b*) shows the destructive ghosting artifacts due to motion. The general matrix inversion solver is applied with the affine transformations as inputs. FIG. 5(*c*) shows the image after motion compensation. Perfect correction may not be provided because part of the image content may move out from the field-of-view, and the matrix is not invertible. The interpolation used in image warping may also introduce minor errors.

Figure 6:
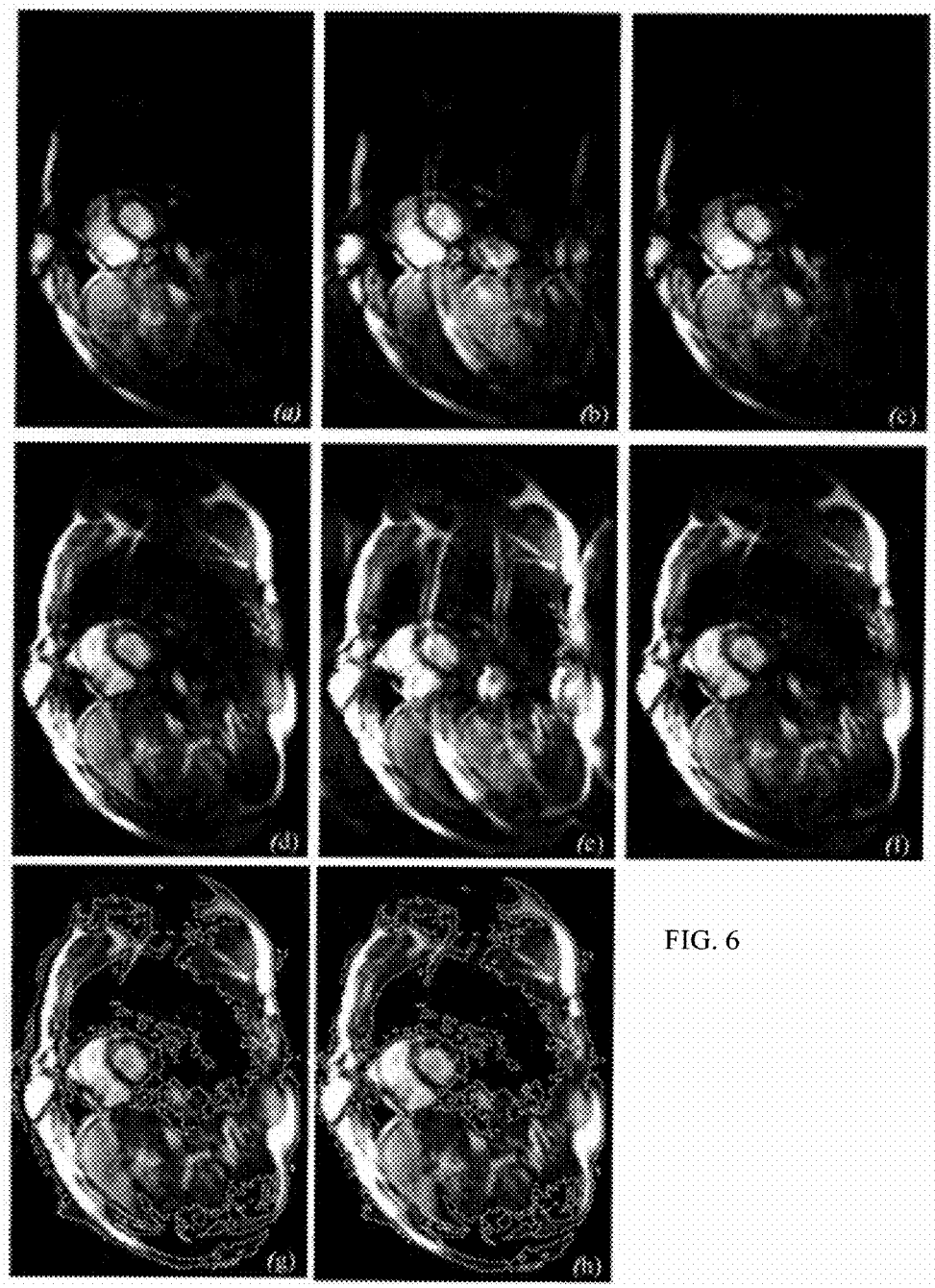
FIGS. 6(a-h) show example simulated multi-coil MR images illustrating motion compensation.

FIG. 6 shows a simulation for multi-coils. The simulation is designed to test the recovery from non-rigid deformation on complex multi-coil images. A 32 coil complex cardiac cine image is reconstructed using TGRAPPA. A total of four simulated deformation fields are generated and applied to warp the image by mimicking a continuous chest wall motion. The k-space subsampling is restricted on the phase-encoding direction (horizontal axis in this case) and sampling pattern is regular with 4 times reduction.

FIG. 6(*a*) shows an original image for one coil. FIG. 6(*b*) shows a ghosting image for this coil after the deformation. The ghosting images are obtained by assembling the corresponding sampled lines from four warped images into one full k-space. FIG. 6(*c*) shows a motion compensated coil image for this coil. The motion compensation solver is applied to each coil independently and thus repeated for 32 times (see FIG. 2). FIGS. 6(*g* and *h*) show the chest wall motion due to applied non-rigid deformation by warping the original image and plotting a contour overlay. Two out of four shots are shown. FIGS. 6(*d-f*) show a sum-of-square of original multi-coil images, a ghosting version and a recovery (motion compensated) result. The motion compensation for MRI reconstruction creates an accurate correction which is near identical to the ground truth.

Figure 7:
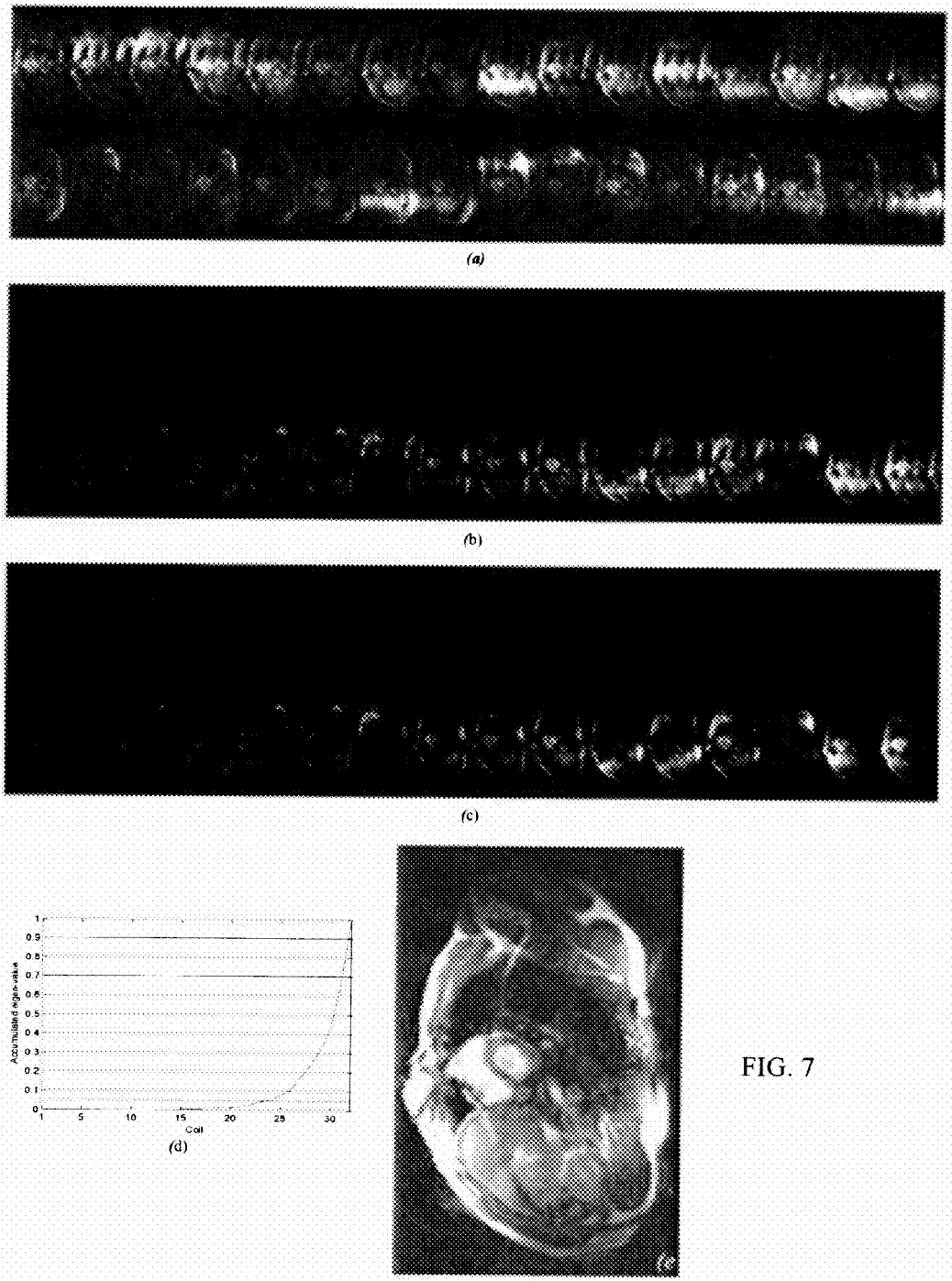
FIGS. 7(a-c and e) show example simulated multi-coil MR images using eigen-coil selection.

FIG. 7 shows the simulation of FIG. 6 repeated, but using eigen-coil images (see FIG. 4). FIG. 7(*a*) shows ghosting artifacts appearing on every coil of the 32 coils. FIG. 7(*b*) shows all of the eigen modes including ghosting artifacts, but only those corresponding to large eigen values have sufficient strength and need correction. Eigen images are selected with 0.05 as a cutoff ratio of the accumulated eigen-values (see FIG. 7(*d*)), resulting in selection of 10 modes out of 32. The correction is applied to these ten ghosted eigen-coil images and results are transformed back to original image space by multiplying the hermitian transpose of eigenvector matrix. FIG. 7(*c*) shows the motion corrected results for the eigen-coil images. FIG. 7(*d*) shows a sum-of-square image of all (e.g., 32) of the eigen images after processing the selected 10 modes for motion correction and leaving the other 22 modes unchanged. As 95% of the total image content is compensated for motion, the corrected image is indiscernible compared to previous simulation with ~70% of processing time saved.

The motion compensation in MRI reconstruction may be used for in vivo imaging. 18 volunteers (10 men, 8 women; mean age 36.7±15.2 years) undergo free-breathing real-time cardiac cine examinations using a clinical 1.5T MR scanner (MAGNETOM Avanto, Siemens AG Healthcare Sector, Erlangen, Germany). The MR sequence parameters include: balanced SSFP readout, TR=1.091TE=0.9 ms, acquired matrix 160×80 (interpolated to 160×120), flip angle 58°, interpolated in-plane resolution 2.4375×2.4375 mm2, slice thickness 10 mm, and bandwidth 1420 Hz/pixel. For every patient, a total of 9 slices are acquired to cover the myocardium. All acquisitions are performed with a 32 phase-array coil (Rapid MR International, Columbus, Ohio, USA) in a time-interleaved manner. The parallel imaging reduction factor is 4 for all scans.

The TGRAPPA and motion compensation are performed on all datasets. Image quality is assessed by both noise and artifacts levels. For the noise levels, a retrospective noise estimation algorithm based on Marcenko-Pastur distribution is applied. This method may be accurate for dynamic imaging where noises between different frames are approximately independent. The results may show the noise standard variances (STD) are actually unchanged with/without motion compensation (mean difference of noise STD is 0.19+/−1.94), which is consistent with visual reading. Compared to TGRAPPA, artifacts may be reduced in many series. Correcting eigen-coil images may be robust and sufficient compared to the per-coil strategy. The saving on computational time may be around 60-70%. The reconstruction time may be 1-2 seconds per frame, including non-rigid registration, general matrix inversion and GRAPPA reconstruction.

Figure 8:
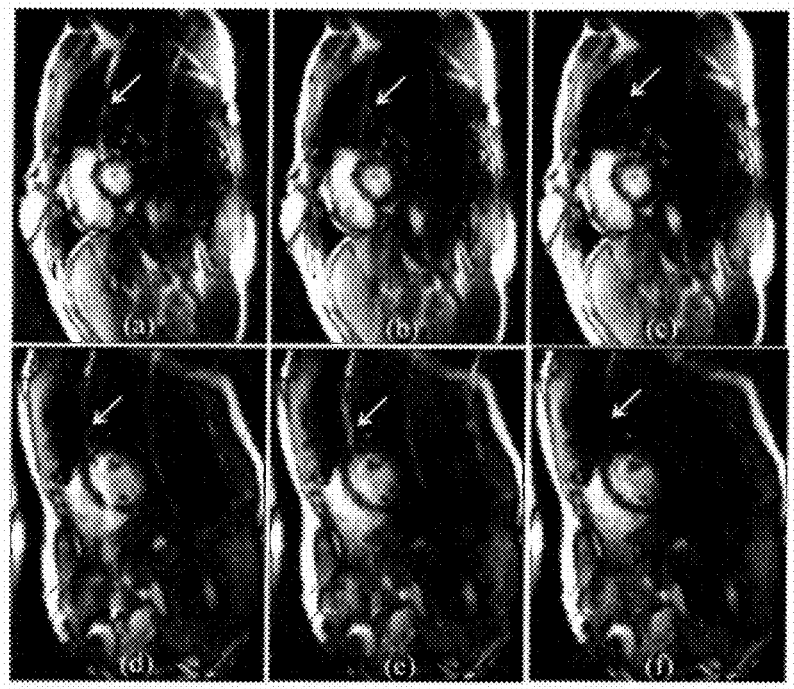
FIGS. 8(a-f) are example real in vivo MR images reconstructed with and without motion compensation.

FIG. 8 shows example images reconstructed using three different methods to estimate ACS signals for TGRAPPA reconstruction. FIGS. 8(a and d) show averaging all under-sampled k-space data. FIGS. 8(b and e) show a moving averaging of every 4 consecutive frames. FIGS. 8(c and f) show a moving averaging every 4 consecutive frames with motion compensation.

Figure 9:
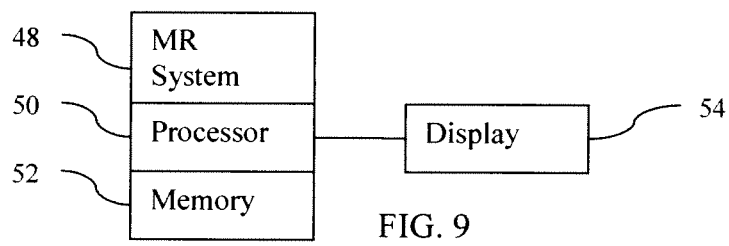
FIG. 9 is one embodiment of a system for motion compensated magnetic resonance reconstruction.

FIG. 9 shows a system for motion compensated magnetic resonance reconstruction. The system includes an MR system 48, a memory 52, a processor 50, and a display 54. Additional, different, or fewer components may be provided. For example, a network or network connection is provided, such as for networking with a medical imaging network or data archival system. In another example, a user interface is provided.

The processor 50 and display 54 are part of a medical imaging system, such as the MR system 48. Alternatively, the processor 50 and display 54 are part of an archival and/or image processing system, such as associated with a medical records database workstation or server. In other embodiments, the processor 50 and display 54 are a personal computer, such as desktop or laptop, a workstation, a server, a network, or combinations thereof. The processor 50, display 54, and memory 52 may be provided without other components for implementing motion compensation in MRI.

The MR system 48 includes one or more coils. For example, a whole body coil is provided. In other examples, an array of local coils is provided. The MR system 48 includes a main field magnet, such as a cryomagnet, and gradient coils. Other processing components may be provided, such as for planning and generating transmit pulses for the coils based on the sequence and for receiving and processing the received k-space data.

The memory 52 can be a graphics processing memory, a video random access memory, a random access memory, system memory, random access memory, cache memory, hard drive, optical media, magnetic media, flash drive, buffer, database, combinations thereof, or other now known or later developed memory device for storing data or video information. The memory 52 is part of the MR system 48, part of a computer associated with the processor 50, part of a database, part of another system, a picture archival memory, or a standalone device.

The memory 52 stores data representing a region, at different times, of a patient. The data is MR data, such as k-space or object space data. The region is a two or three-dimensional region. The region is of any part of the patient, such as a region within the chest, abdomen, leg, head, arm, or combinations thereof. The data is from scanning the region by the MR system 48. The memory 52 may alternatively or additionally store data during processing, such as storing eigen information, registration information, reconstruction information, coil images, initial reconstruction images, matrix information, and/or an output image.

The memory 52 or other memory is alternatively or additionally a computer readable storage medium storing data representing instructions executable by the programmed processor 50 for motion compensated magnetic resonance reconstruction. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 50 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for compensating for motion in MR reconstruction. The processor 50 is a single device or multiple devices operating in serial, parallel, or separately. The processor 50 may be a main processor of a computer, such as a laptop or desktop computer, or may be a processor for handling some tasks in a larger system, such as in an imaging system. The processor 50 is configured by instructions, design, hardware, and/or software to be able to perform the acts discussed herein, such as inverse-consistent non-rigid registration and reconstruction. The processor 50 is or implements the matrix inversion solver.

The processor 50 performs motion compensation for multi-shot/multi-segment MR imaging using inverse-consistent non-rigid registration. The conjugate transpose of mixing matrix $g^H$ is composited using the inverse deformation field $u^{-1}$ estimated from the inverse-consistent non-rigid registration. For multiple coils, the general matrix inversion and corresponding motion detection are performed on selected eigen-channels or for signal from actual coils. The motion compensated reconstruction performed by the processor 50 for the multi-coil imaging uses the inverse-consistent non-rigid registration with parallel imaging (see FIG. 2) or uses the inverse-consistent non-rigid registration and eigen-channel with parallel imaging (see FIG. 3). The motion compensated reconstruction performed by the processor 50 may be used for the time-interleaved multi-coil dynamic imaging with inverse-consistent non-rigid registration and eigen-channel for parallel imaging (see FIG. 4).

The display 54 is a monitor, LCD, projector, plasma display, CRT, printer, or other now known or later developed devise for outputting visual information. The display 54 receives images, graphics, or other information from the processor 50, memory 52, or MR system 48. One or more MR images are displayed. The images are of dynamic or moving tissue, such as the heart, but have reduced artifacts due to motion as compared to reconstruction without motion compensation. The images may be generated and displayed in real-time with the scanning of the patient. The images are generated within 1-5 seconds from the scanning, allowing viewing and diagnosis at the time of imaging the patient or while the patient is still in a position for further MRI.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for motion compensated magnetic resonance reconstruction, the method comprising:
    acquiring, for each of multiple coils, magnetic resonance data representing an interior region of a patient with multiple shots;
    performing, for each of the multiple coils, an initial reconstruction for each of the shots;
    determining, for each of the multiple coils, motion between the initial reconstructions of the multiple shots with an inverse-consistent non-rigid registration;
    reconstructing, for each of the multiple coils, a coil image with a matrix inversion solver as a function of the motion and the magnetic resonance data for the multiple shots, the coil images for the multiple coils representing the interior region of the patient;
    combining the coil images from the multiple coils into an output image; and
    displaying the output image representing the interior region of the patient.

2. The method of claim 1 wherein the multiple coils comprises all coils used for the output image, and wherein determining the motion comprises determining for each of the coils independently.

3. The method of claim 1 wherein the multiple coils comprise a sub-set of all coils, wherein combining comprises combining for all the coils and determining comprises determining for the sub-set and not all of the coils.

4. The method of claim 3 further comprising:
    summing the magnetic resonance data from the multiple shots for each of the coils
    combining the summed magnetic resonance data from all of the coils;
    selecting the sub-set as a function of eigen-coil images of the combined data.

5. The method of claim 1 wherein acquiring comprises acquiring the magnetic resonance data as time-interleaved, multi-coil dynamic imaging; and
    the method further comprising identifying the magnetic resonance data for each shot as a division of k-space data.

6. The method of claim 1 wherein determining the motion comprises estimating pixel-wise dense forward and backward deformation fields with the inverse-consistent non-rigid registration.

7. The method of claim 1 wherein determining the motion comprises estimating the motion independent of the reconstructing.

8. The method of claim 1 wherein the motion comprises a motion field, and wherein reconstructing comprises treating the motion field as a prior in the matrix inversion solver.

9. The method of claim 1 wherein reconstructing comprises applying a conjugate gradient solver and the inverse matrix solver.

10. The method of claim 1 wherein acquiring comprises transforming to object space for each shot, wherein determining the motion comprises determining the motion in object space, and wherein reconstructing comprises compensating in the object space for the motion, Fourier transforming an output of the compensating into k-space, solving with the inverse matrix solver, and inversely transforming for each shot into object space.

11. The method of claim 1 wherein determining comprises iteratively descending a gradient of a symmetric energy functional by alternating a registration direction after each iteration while enforcing inverse consistency.

12. The method of claim 1 wherein reconstructing comprises compositing a conjugate transpose of a mixing matrix using an inverse deformation field estimated from the inverse-consistent non-rigid registration as the motion.

13. In a non-transitory computer readable storage medium, having stored therein data representing instructions executable by a programmed processor for motion compensated magnetic resonance reconstruction, the storage medium comprising instructions for:
    acquiring k-space magnetic resonance data with multiple shots;
    determining motion between the shots of the multiple shots, the determining comprising applying an inverse-consistent non-rigid registration in object space; and
    reconstructing an image as a function of the k-space magnetic resonance data from the multiple shots and the determined motion from the object space.

14. The non-transitory computer readable storage medium of claim 13 wherein determining the motion comprises calculating an inverse deformation field from the inverse-consistent non-rigid registration, and wherein reconstructing comprises compositing a conjugate transpose of a mixing matrix using the inverse deformation field.

15. The non-transitory computer readable storage medium of claim 13 wherein determining comprises determining the motion from initial reconstructions for each of the shots, and wherein reconstructing comprises applying a matrix inversion solver.

16. The non-transitory computer readable storage medium of claim 15 wherein acquiring comprises acquiring the magnetic resonance data with the multiple shots for each of multiple coils, and wherein applying the matrix inversion solver comprises performing a matrix inversion on an eigen-channel.

17. The non-transitory computer readable storage medium of claim 13 wherein acquiring comprises:
    acquiring the magnetic resonance data as time-interleaved, multi-coil dynamic imaging; and
    identifying the magnetic resonance data for each shot as a division of k-space data.

18. The non-transitory computer readable storage medium of claim 13 wherein determining the motion with the inverse-consistent non-rigid registration comprises:
    calculating a first update of a forward transformation of a first digital image to a second digital image from a previous update of the forward transformation and a gradient of a cost function of the first and second digital images;
    calculating a first update of a backward transformation of the second digital image to the first digital image from an inverse of the first update of the forward transformation;
    calculating a second update of the backward transformation from first update of the backward transformation and the gradient of a cost function of the second and first digital images; and calculating a second update of the forward transformation from an inverse of the second update of the backward transformation.

19. In a non-transitory computer readable storage medium, having stored therein data representing instructions executable by a programmed processor for motion compensated magnetic resonance reconstruction, the storage medium comprising instructions for:
performing multi-segment magnetic resonance imaging; and
compensating for motion in the multi-segment magnetic resonance imaging with an inverse-consistent non-rigid registration.

20. The non-transitory computer readable storage medium of claim 19 wherein compensating comprises calculating an inverse deformation field with the inverse-consistent non-rigid registration and compositing a conjugate transpose of a mixing matrix with the inverse deformation field.

21. The non-transitory computer readable storage medium of claim 19 wherein the reconstruction is for multiple coils and wherein performing comprises reconstructing with a general matrix inversion on an eigen-channel.

22. The non-transitory computer readable storage medium of claim 21 wherein performing comprises performing time-interleaved multi-coil dynamic imaging.

* * * * *